(12) United States Patent
Li et al.

(10) Patent No.: US 7,943,452 B2
(45) Date of Patent: *May 17, 2011

(54) GATE CONDUCTOR STRUCTURE

(75) Inventors: Wai-Kin Li, Beacon, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1097 days.

This patent is subject to a terminal disclaimer.

(21) Appl. No.: 11/609,496

(22) Filed: Dec. 12, 2006

(65) Prior Publication Data
US 2008/0135987 A1 Jun. 12, 2008

(51) Int. Cl.
H01L 21/00 (2006.01)
H01L 21/338 (2006.01)
H01L 21/337 (2006.01)
H01L 21/8238 (2006.01)

(52) U.S. Cl. ......... 438/199; 438/157; 438/176; 438/200

(58) Field of Classification Search .................. 438/157, 438/176, 195, 199, 200
See application file for complete search history.

(56) References Cited

U.S. PATENT DOCUMENTS

| | | | |
|---|---|---|---|
| 5,770,507 A | 6/1998 | Chen et al. | |
| 6,127,712 A | 10/2000 | Wu | |
| 6,407,416 B2 | 6/2002 | Mori | |
| 2005/0153562 A1* | 7/2005 | Furukawa et al. | 438/694 |
| 2006/0240361 A1* | 10/2006 | Lee et al. | 430/313 |
| 2006/0249784 A1 | 11/2006 | Black et al. | |
| 2007/0218633 A1* | 9/2007 | Prinz et al. | 438/267 |
| 2007/0293041 A1* | 12/2007 | Yang et al. | 438/637 |
| 2008/0083991 A1* | 4/2008 | Yang et al. | 257/758 |
| 2008/0099845 A1* | 5/2008 | Yang et al. | 257/351 |
| 2008/0132070 A1* | 6/2008 | Li et al. | 438/682 |

OTHER PUBLICATIONS

K.W.Guarini, et al., "Nanoscale Petterning Self-assembled Polymers for Semiconductor Applications"—VAC. Sci, Technol. B, vol. 19, No. 6, (Nov./Dec. 2001)—pp. 2784-2789.
C.T. Black—"Integration of Self Assembly fr Semiconductor Microelectronics"—IEEE (2005) Custom Integrated Circuits Conference—pp. 87-91.
Paul F. Nealey, et al.—"Self-Assembling Resists for Nanolithography"—Department of Chemical and Biological Engineering and Center for NanoTechnology—IEEE (2005 ).
FIS920060376CN1_OA1_20090605—Wai-Kin Li, et al.—Application #200710170218.1—Filed Nov. 15, 2007.

* cited by examiner

Primary Examiner — Laura M Menz
Assistant Examiner — James M Mitchell
(74) Attorney, Agent, or Firm — Joseph Petrokaith

(57) ABSTRACT

A gate conductor structure is provided having a barrier region between a N-type device and a P-type device, wherein the barrier region minimizes or eliminates cross-diffusion of dopant species across the barrier region. The barrier region comprises at least one sublithographic gap in the gate conductor structure. The sublithographic gap is formed by using self-assembling copolymers to form a sublithographic patterned mask over the gate conductor structure. According to one embodiment, at least one sublithographic gap is a slit or line that traverses the width of the gate conductor structure. The sublithographic gap is sufficiently deep to minimize or prevent cross-diffusion of the implanted dopant from the upper portion of the gate conductor. According to another embodiment, the sublithographic gaps are of sufficient density that cross-diffusion of dopants is reduced or eliminated during an activation anneal such that changes in Vt are minimized.

7 Claims, 22 Drawing Sheets

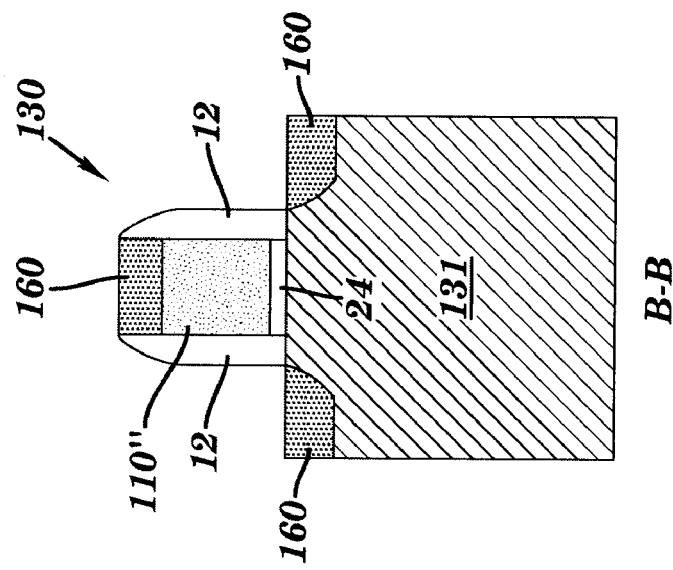
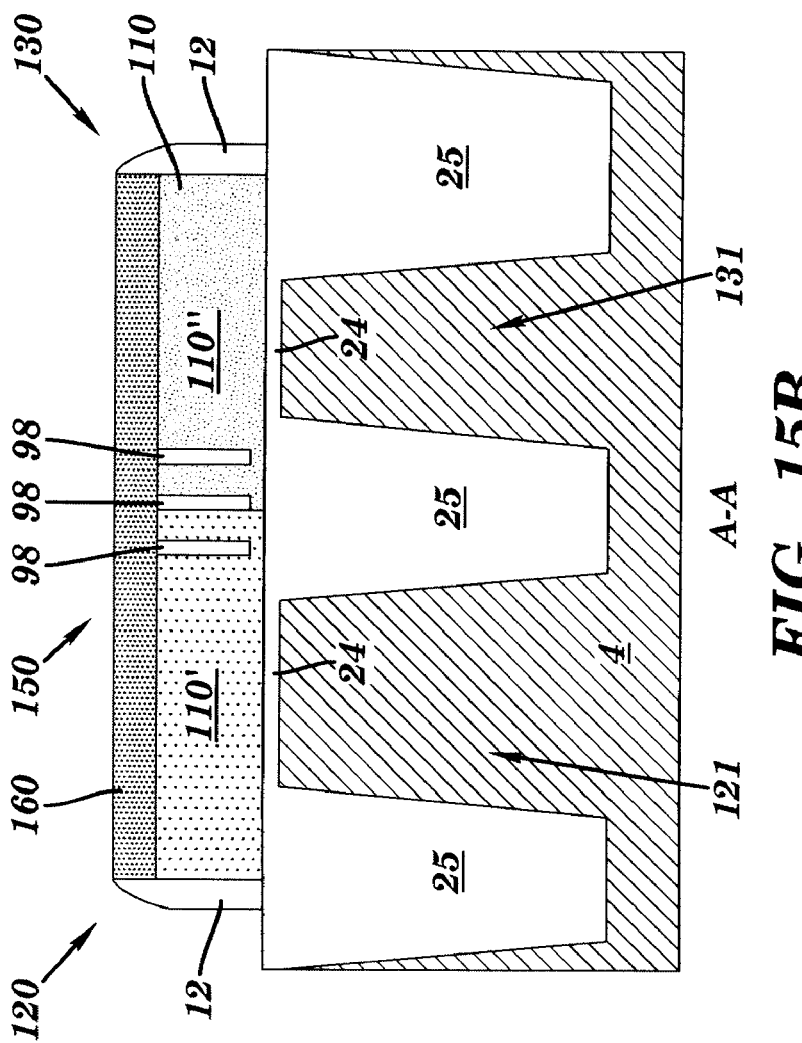
FIG. 15B
FIG. 15C

GATE CONDUCTOR STRUCTURE

BACKGROUND OF THE INVENTION

1. Field of the Invention

This invention relates to semiconductor devices of different types that closely spaced and are connected by conductive connectors. More specifically, the present invention relates to different complementary metal-oxide-semiconductor (CMOS) devices that are adjacent to each other, such as n-channel field effect transistors (n-FETs) and p-channel field effect transistors (p-FETs), which connected by conductive connectors that include different dopants associated with the different CMOS devices.

2. Description of Related Art

As semiconductor devices scale, spacing between the CMOS devices become smaller. Devices of different types, such as field effect transistors (FETs) having different performance characteristics, may be placed adjacent to each other, and share certain physical components. For example, in devices such as a static random access memory (SRAM), adjacent pFET and nFET devices may share a common gate conductor, which at the pFET includes a different dopant than at the nFET.

However, as the spacing between devices decreases, dopants of different types may diffuse along a shared gate conductor to such an extent that it encroaches on and changes the properties of the adjacent device having a different dopant. Such cross diffusion may adversely alter properties such as the threshold voltage of a transistor. The undesired variation of device property results in poor product performance and yield.

For example, FIG. 1 illustrates an nFET device 20 adjacent to a pFET device 30, having channel regions 21, 31 formed in a semiconductor substrate 4. The nFET 20 is electrically isolated from the pFET 30 by isolation regions 25. Gate dielectric layers 24 are formed atop the channel region of the nFET 21 and the channel region of the pFET 31. Overlaying both the nFET channel 21 and pFET channel 31 atop the gate dielectric 24 is a gate conductor 10, which includes an N+ doped region 10' over the nFET channel 21 and a P+ doped region 10" over the pFET channel 31. A spacer 12 is formed on the sidewalls of the gate conductor 10. However, the N+ and P+ dopants may cross diffuse in the gate conductor region 10''' between the nFET and pFET due to effects such as implant mask overlay errors and thermal anneal. If the cross-diffusion region 10''' encroaches over the channel regions of the nFET or pFEt, there may be changes in work function. To avoid this problem, the spacing 14 between the nFET and pFET must be maintained sufficiently large so that the cross-diffusion region 10''' encroachment over the device channel will be minimized, which limits scaling of chip density.

Referring to FIG. 2, the Vt for a pFET, which is adjacent an nFET in an SRAM, is plotted on the vertical axis as a function of gate length Lpoly between the pFET and the nFET. The lower grouping of data points (line 33) represents widely spaced devices. The dark filled circles represent data points without additional thermal anneal while the filled triangles represent data points with additional thermal budget. Since the nFET and pFET are sufficiently spaced apart, there would be no Vt shift. However, if the nFET and pFET are sufficiently close together (open circles 35 and triangles 37), the additional thermal budget (open triangles 37) exhibit a significant shift in Vt due to cross diffusion relative to the pFETs prior to the anneal (open circles 35).

In view of the above, it would be desirable to form a gate conductor structure with reduced dopant cross diffusion without impacting density of the circuit layout and allow scaling of closely spaced devices.

SUMMARY OF THE INVENTION

The present invention provides a method that combines a conventional lithographic technology with the self-assembling block copolymer technology to achieve a sub-lithographic dimension slit in a gate conductor to reduce dopant diffusion in CMOS devices.

Dopant diffusion is determined by the cross-sectional area of the diffusion path. As the diffusion path area is reduced, diffusion is reduced. It is desirable to create a slit or an air gap in the diffusion path with sublithographic dimension hence not to impact circuit layout density.

Self-assembling block copolymers are capable of self-organizing into nanometer-scale patterns, enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

According to a first aspect of the invention, a gate conductor structure is provided comprising a sublithographic gap having a sublithographic dimension. The sublithographic gap preferably traverses the width of the gate conductor structure. The sublithographic gap is preferably located between a N-type and a P-type device. The gap preferably extends from at least the upper portion of said gate conductor structure where an implant concentration is highest.

According to another aspect of the invention, a gate conductor structure comprises a barrier region between a N-type and a P-type device. According to a first embodiment, the barrier region comprises a sublithographic gap that traverses the width of the gate conductor structure. According to another embodiment, the sublithographic gap extends to a depth so that the concentration of said dopant at the bottom of the gap is less than 50% of the highest concentration of said dopant in the gate conductor.

According to another aspect of the invention, the barrier region comprises a plurality of sublithographic features having a sufficiently high density such that the step of patterning said gate conductor forms a barrier region such that diffusion of dopants across the barrier region is reduced or eliminated during an activation anneal so that changes in Vt are minimized.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The present invention will be understood and appreciated more fully from the following detailed description of the invention, taken in conjunction with accompanying drawings of which:

FIGS. 15A-15C illustrates top-down and cross-sectional views of a gate conductor structure according to an embodiment of the present invention.

Figure 1A:
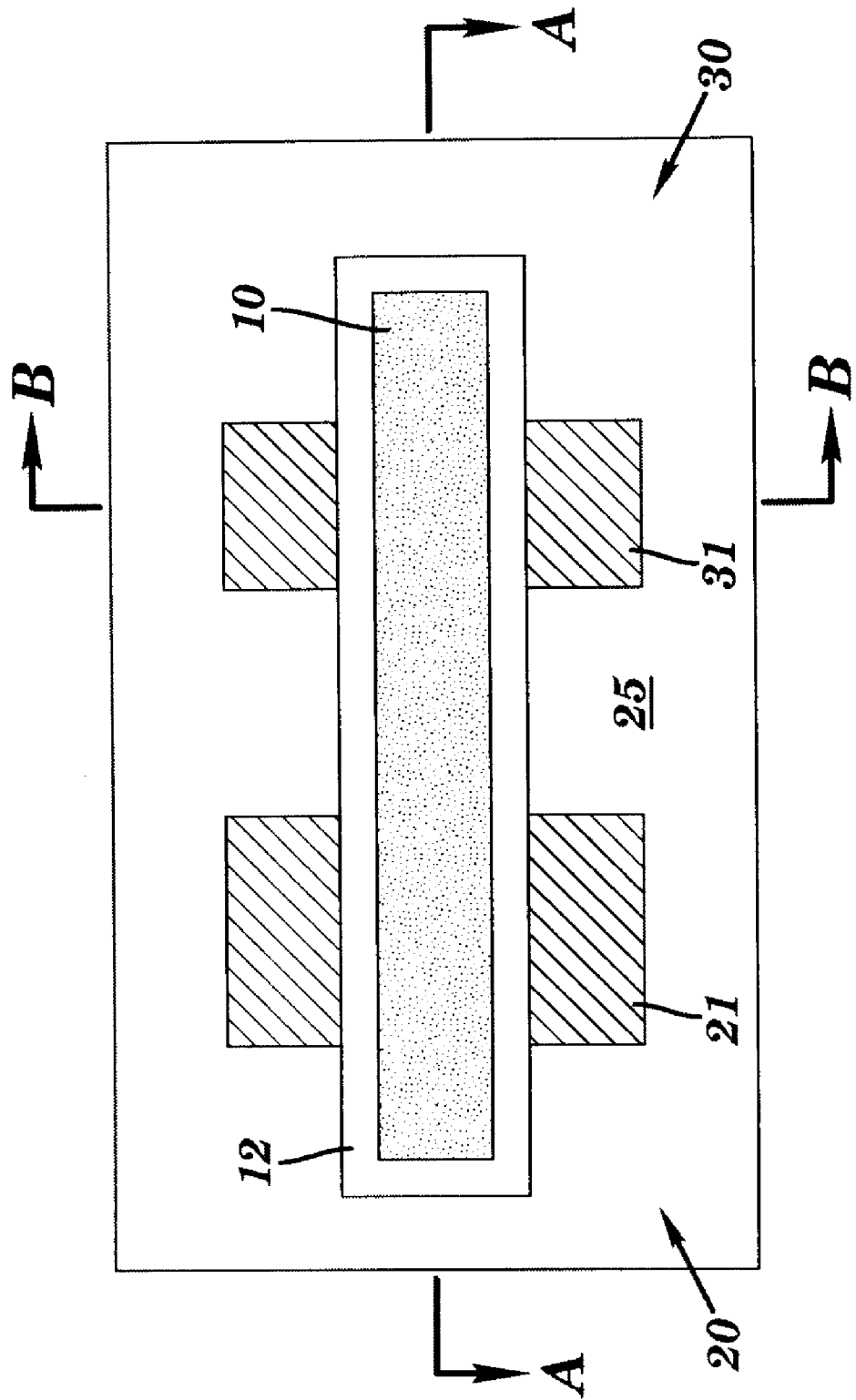
FIGS. 1A-1C illustrates top-down and cross-sectional views of prior art adjacent nFET and pFET structures that share a gate conductor having a cross-diffusion region.
Figure 1B:
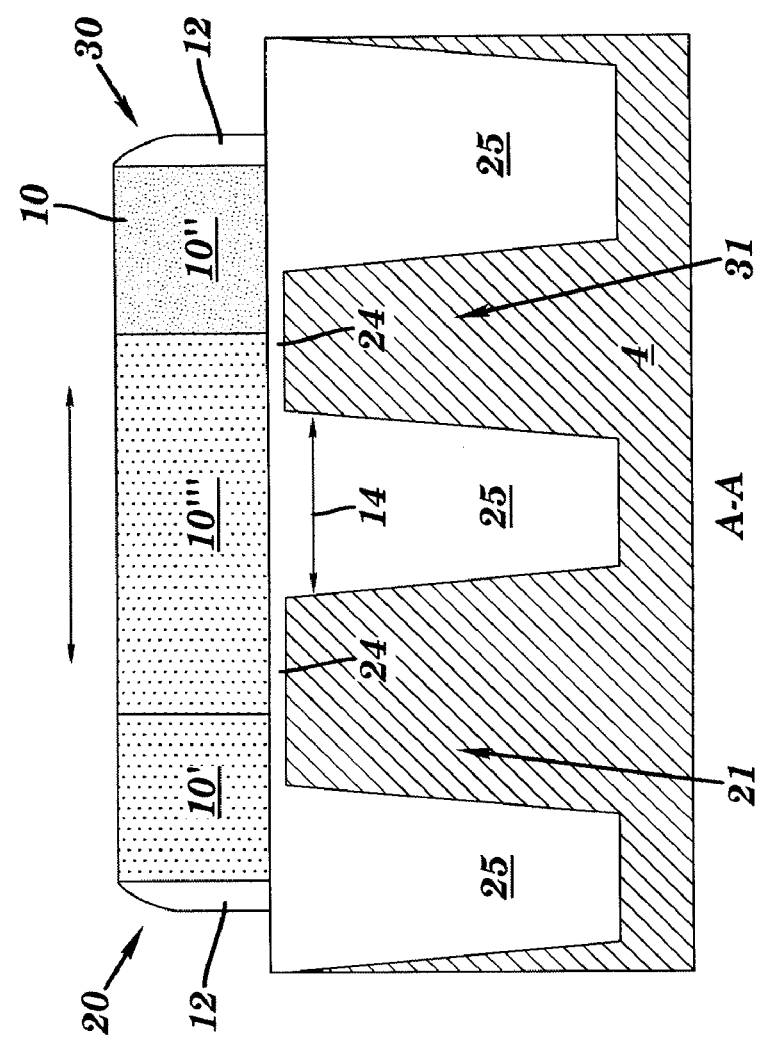
Figure 1C:
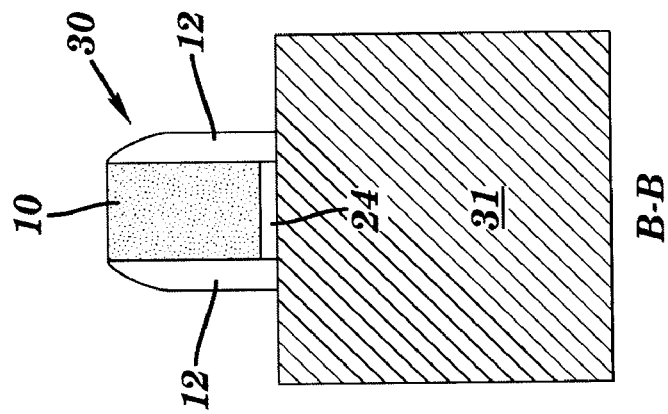
Figure 2:
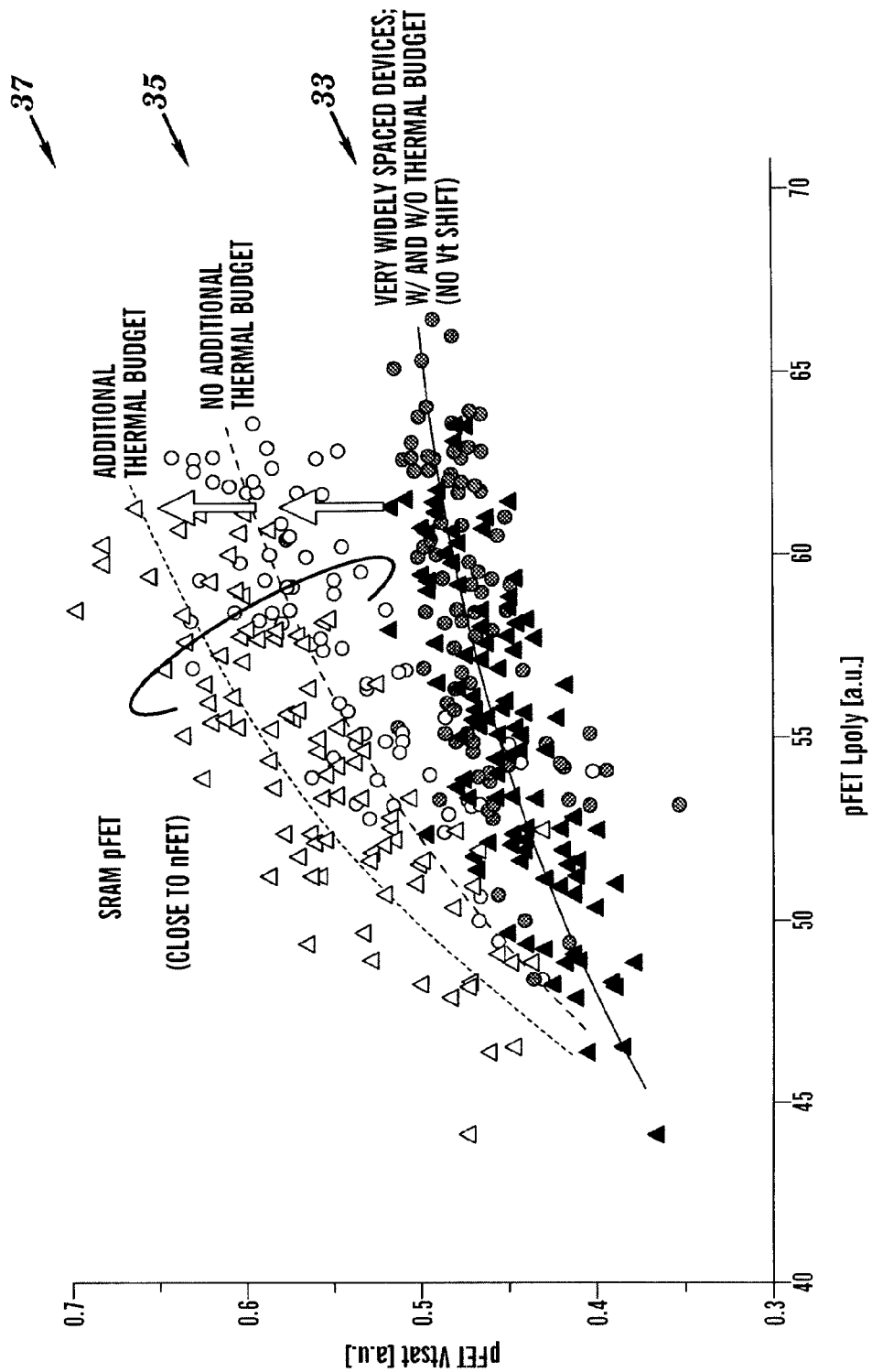
FIG. 2 illustrates Vt shift in a pFET device due to cross-diffusion in a gate conductor.

It will be appreciated that for simplicity and clarity of illustration, elements shown in the drawings have not necessarily been drawn to scale. For example, the dimensions of some of the elements may be exaggerated relative to other elements for purposes of clarity.

DETAILED DESCRIPTION OF THE INVENTION

The present invention provides for a method that combines a conventional lithographic process with self-assembling block copolymer technology to achieve a structure including a sub-lithographic barrier region in a gate conductor structure that reduces dopant diffusion in CMOS devices.

Self-assembling block copolymers are capable of self-organizing into nanometer-scale patterns. See, for example, C. T. Black, "Integration of Self Assembly for Semiconductor Microelectronics", Proceedings IEEE 2005 Customer Integrated Circuits Conference, pp. 87-91, the disclosure of which is hereby incorporated by reference in its entirety. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Dopant diffusion is determined by the cross-sectional area of the diffusion path. As the cross-sectional area of the diffusion path area is reduced, diffusion is reduced. Thus, it would be desirable to reduce the cross-sectional area of the diffusion path in the gate conductor without impacting circuit layout density.

In accordance with the present invention, a sub-lithographic openings or air gaps are formed in the gate conductor between adjacent devices to form a barrier region such that the cross-sectional area of the diffusion path is significantly reduced or eliminated. In accordance with the invention, the sub-lithographic openings in the barrier region are formed using a self-assembling copolymer process to form the barrier region.

Figure 3A:
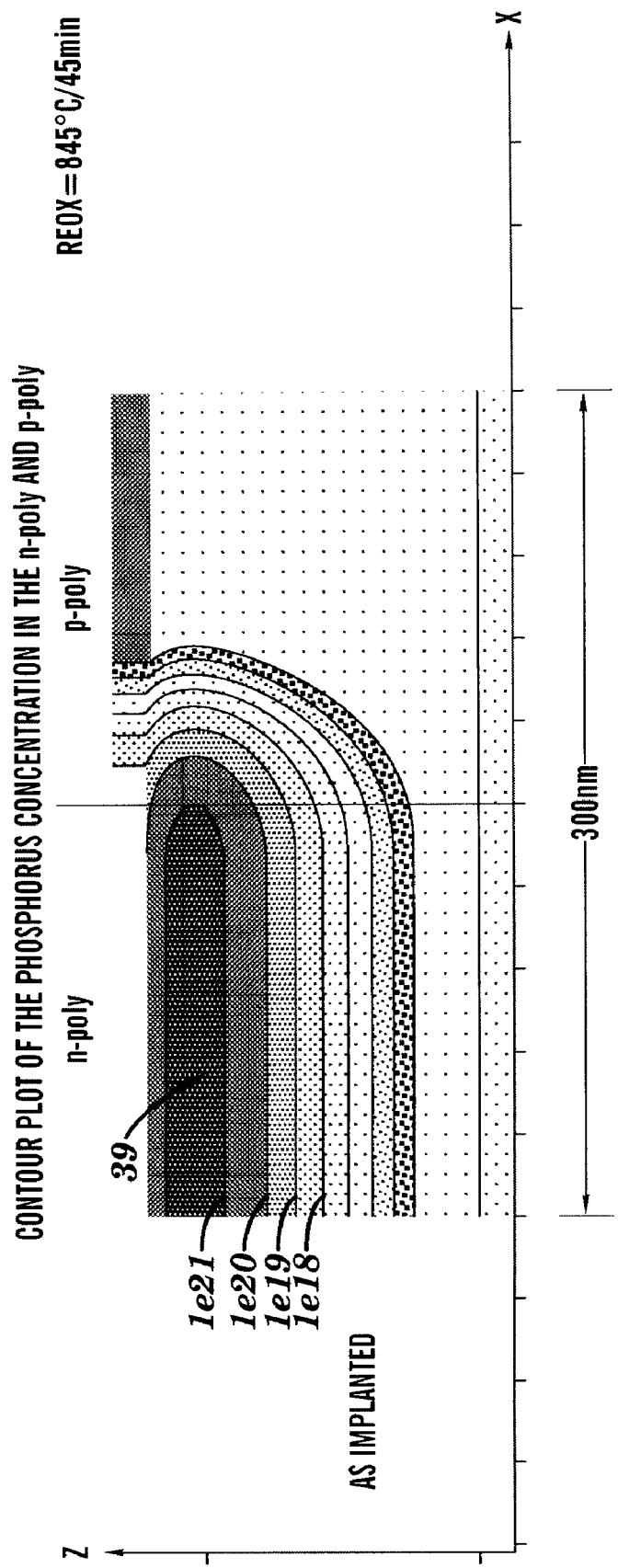
FIGS. 3A-3C illustrates a cross-sectional view of simulations of dopant concentration in a gate conductor.
Figure 3B:
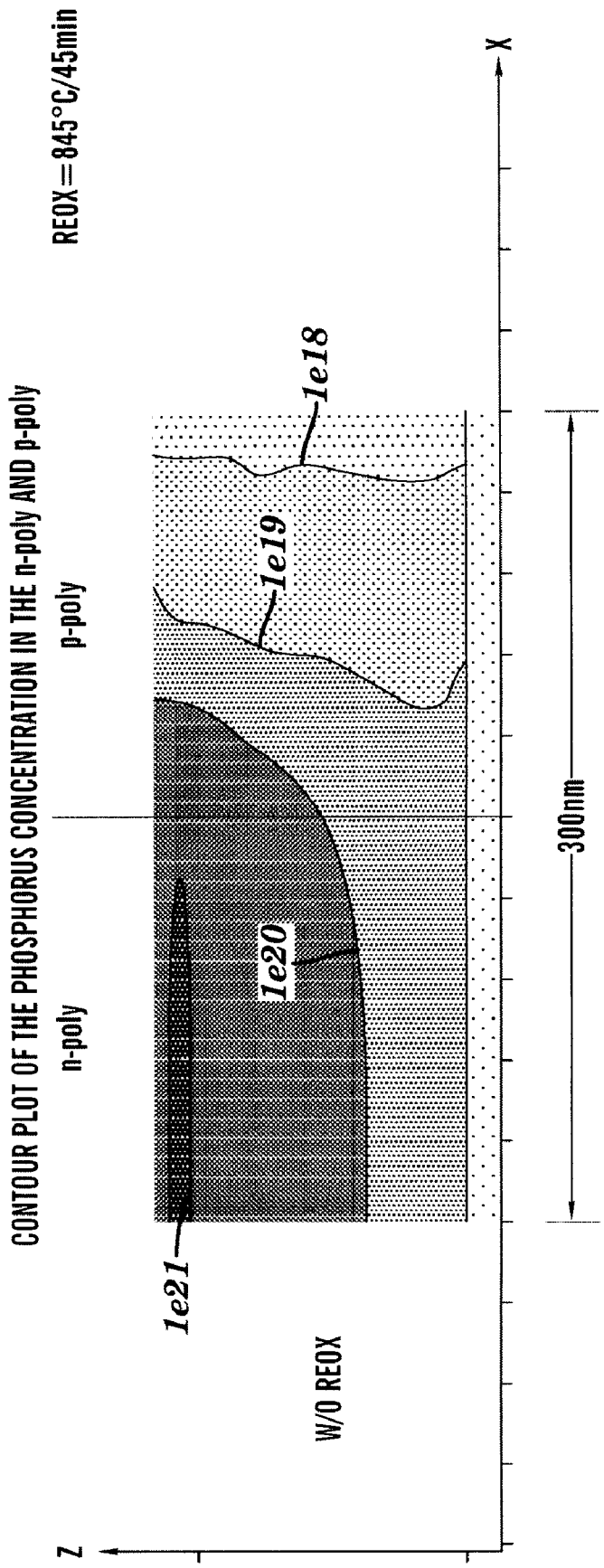
Figure 3C:
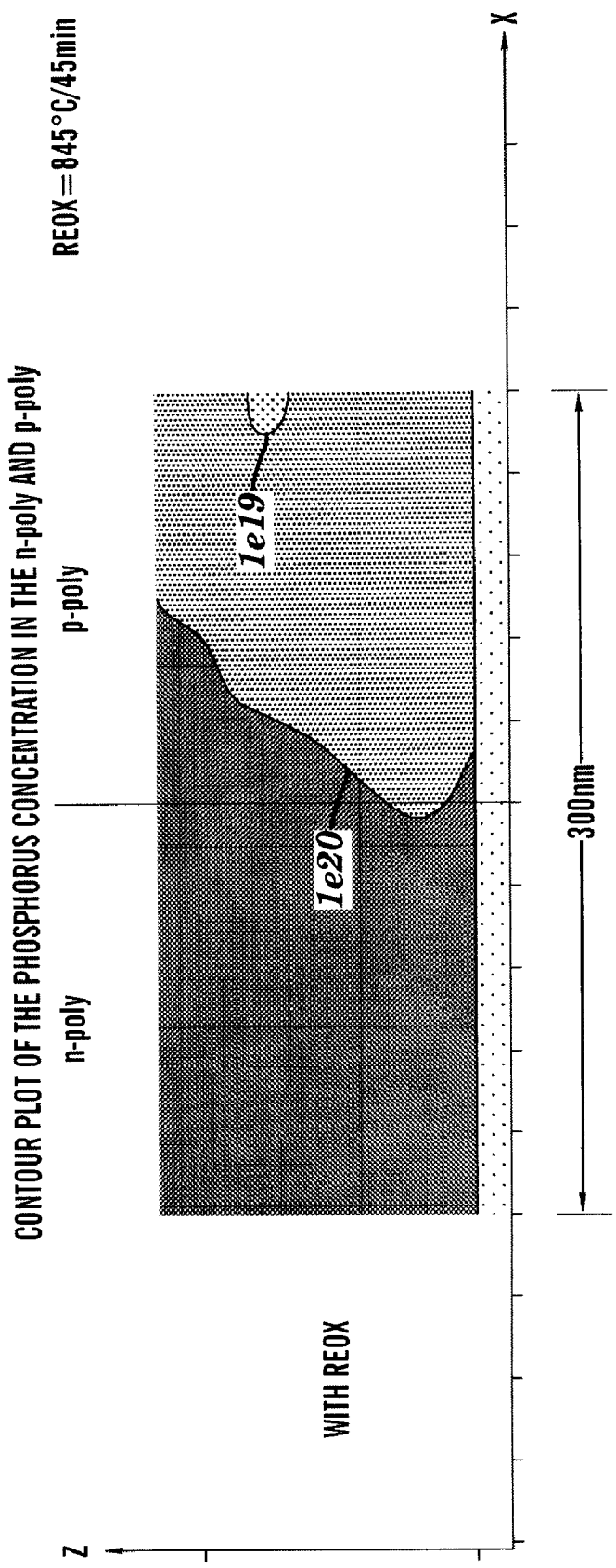

Referring to FIG. 3, a simulation of phosphorus concentration in an n-doped gate conductor is illustrated. FIG. 3A illustrates the concentration of the phosphorus as implanted. Note that the region of highest concentration 39 is near the surface of the gate conductor after implantation. FIG. 3B illustrates diffusion after a first anneal but before a second anneal. FIG. 3C illustrates the concentration after a second anneal, designated as REOX anneal. Note that even after the first anneal and REOX anneal, the highest concentration of phosphorous is near the top of the gate conductor.

Figure 4A:
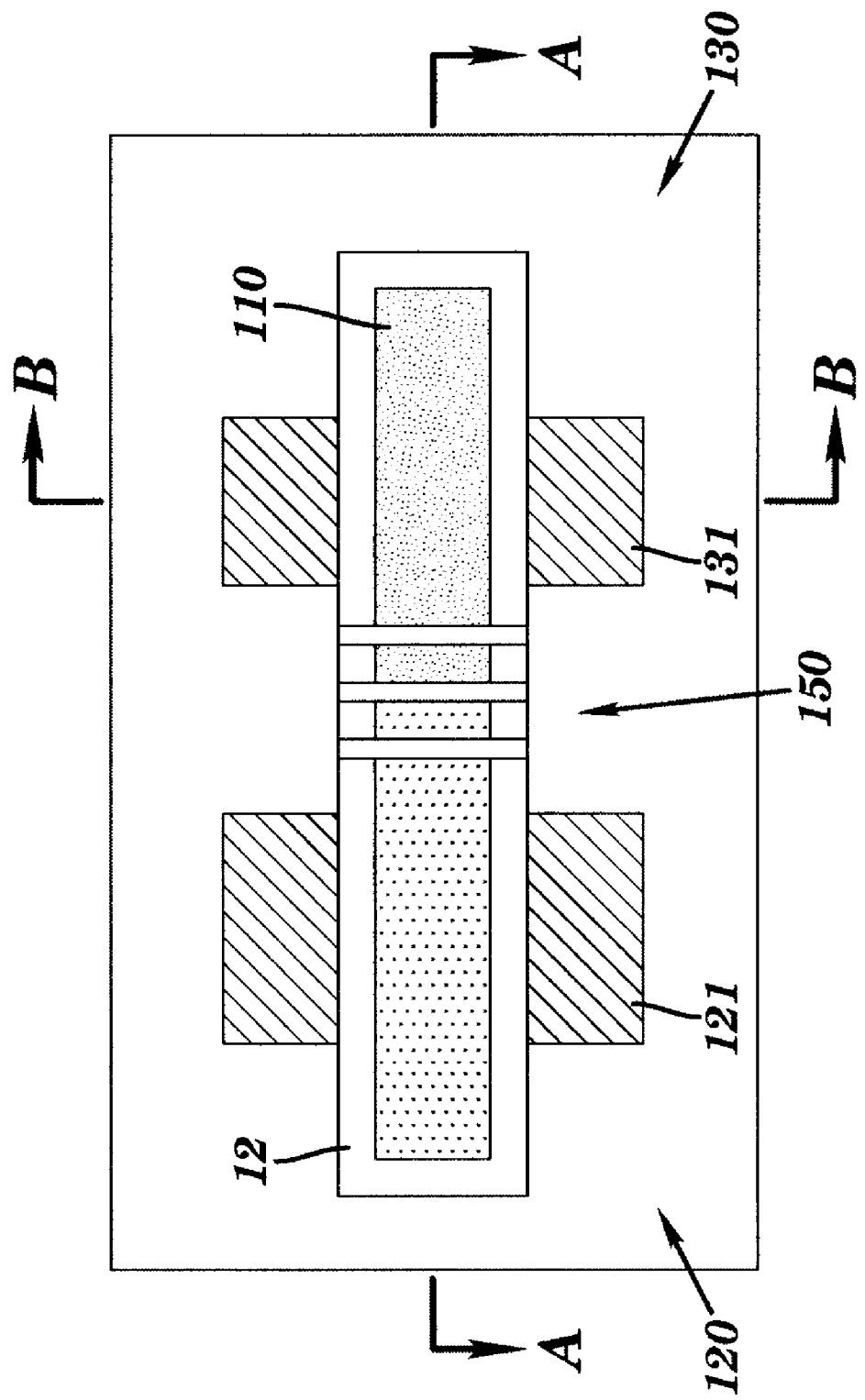
FIGS. 4A-4C illustrates top-down and cross-sectional views of one embodiment of a gate conductor structure according to the invention.
Figure 4C:
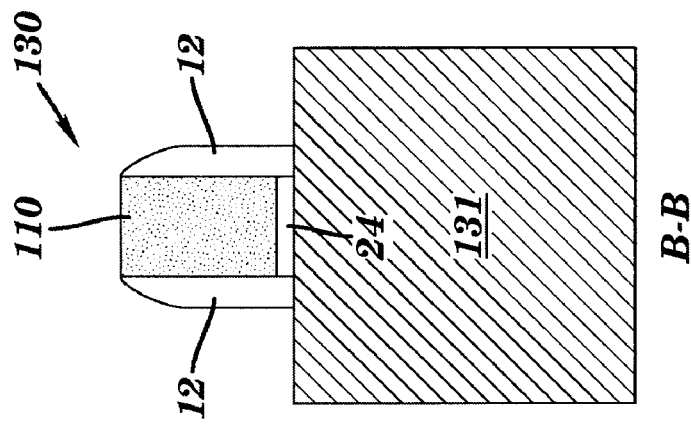
Figure 4B:
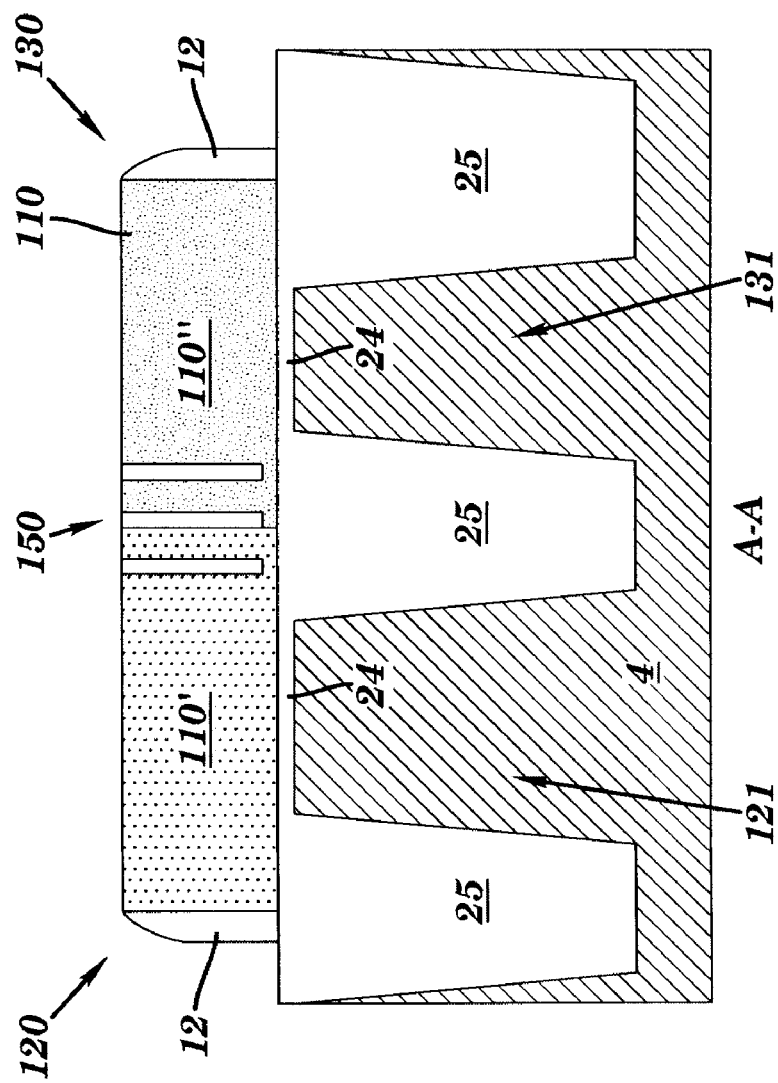

Referring to FIGS. 4A-4C, according to one embodiment of the present invention, slits or airgaps are provided in a barrier region 150 within the gate conductor 110 between the nFET 120 and the pFET 130. A spacer 12 is formed on the sidewalls of the gate conductor 110. The gate conductor 110 includes a first doped region 110' and a second doped region 110" positioned over the nFET channel 121 and pFET channel 131, respectively. The barrier region 150 is located between the first doped region 110' and the second doped region 110". Preferably slits or airgaps in the barrier region 150 traverse the width of the gate conductor 110 so as to substantially reduce or eliminate the cross-sectional area of the diffusion path between the nFET 120 and the pFET 130. The depth of the gaps need not extend all the way to the bottom of the gate conductor 110, since the highest concentration of dopant is likely to be near the top of the gate conductor 110 where the dopant was implanted. Preferably the depth of the gap is such that the concentration of the dopant at the bottom of the air gap is less than 50% of the highest dopant concentration in the gate conductor.

Figure 5A:
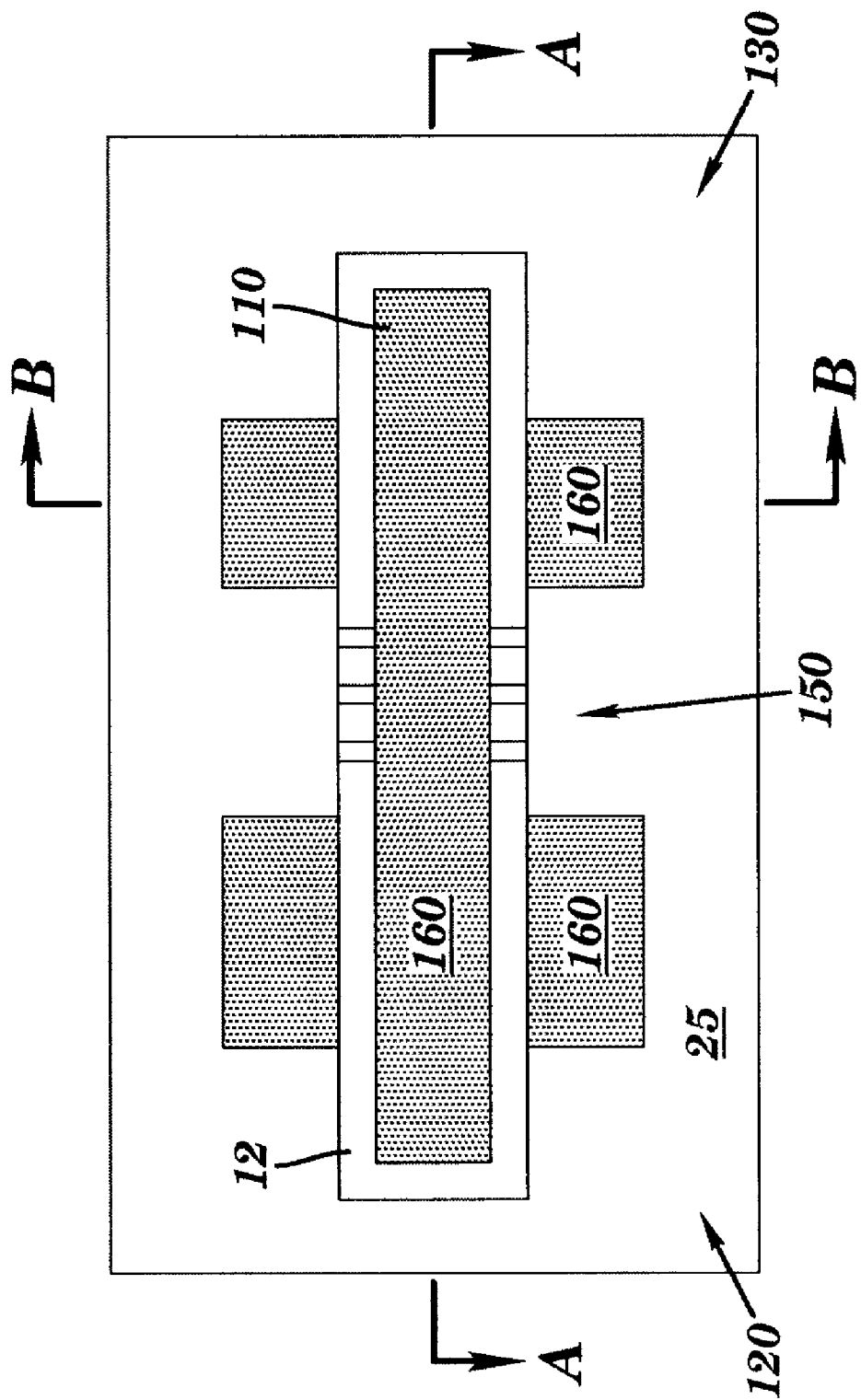
FIGS. 5A-5C illustrates top-down and cross-sectional views of one embodiment of a gate conductor structure according to the invention.
Figure 5C:
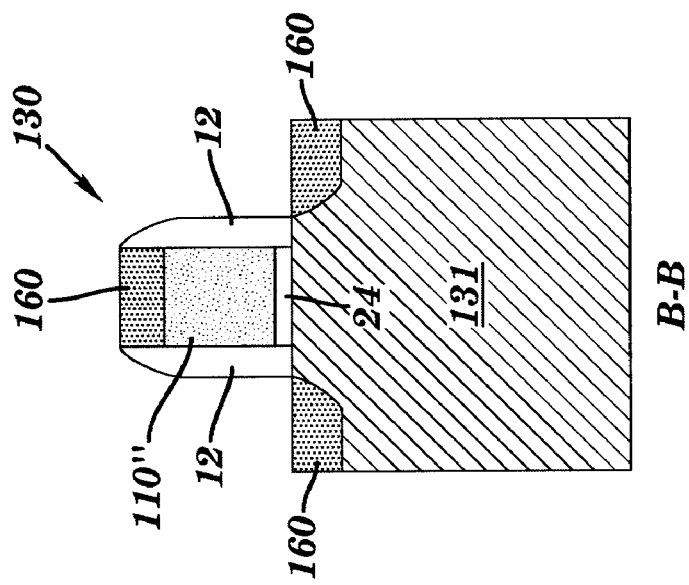
Figure 5B:
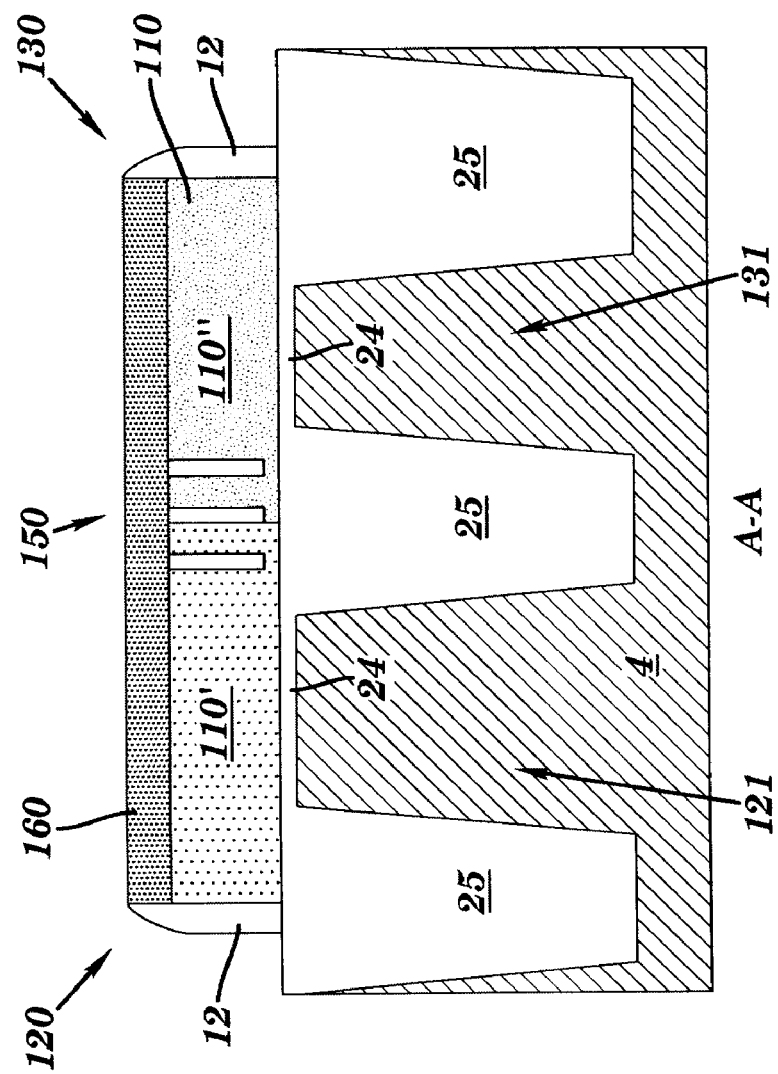

Subsequently, referring to FIG. 5, a silicide may be formed on top of the gate conductor 110 and the source/drain regions, including over the gaps in the barrier region 150. The silicide, or semiconductor-metal alloy, is formed by sputtering metal on the surface of the wafer. During a subsequent anneal step, metal reacts with silicon including silicon substrate (source and drain) and silicon in the gate conductor. The non-reacted metal is then stripped from the wafer surface. This process is commonly called salicidation. The metal silicide may be formed on the top, sidewalls, and bottom of the air gaps.

Figure 6A:
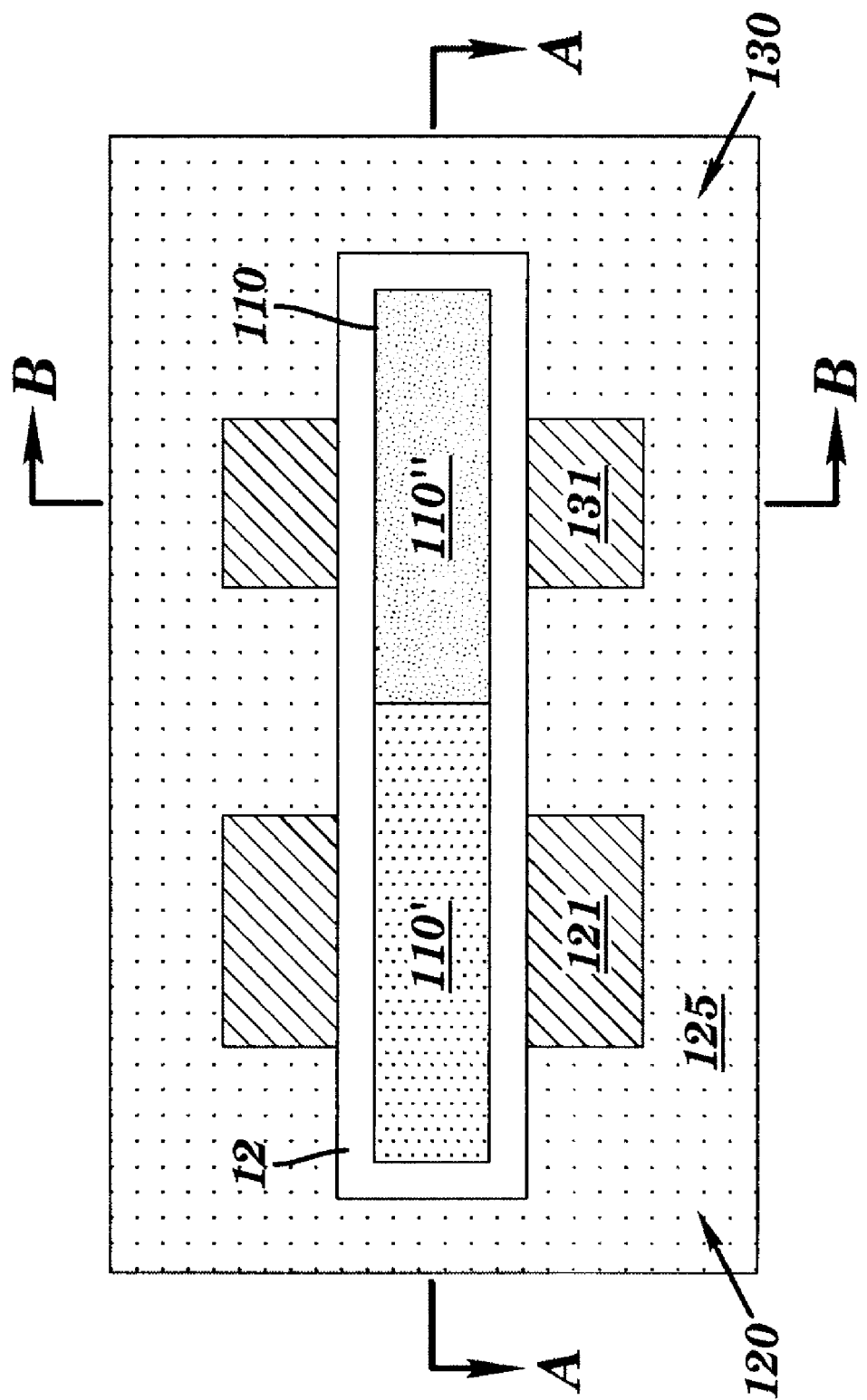
FIGS. 6A-6C illustrates top-down and cross-sectional views at an intermediate step for forming a gate conductor structure according to an embodiment of the invention.
Figures 6B, 6C:
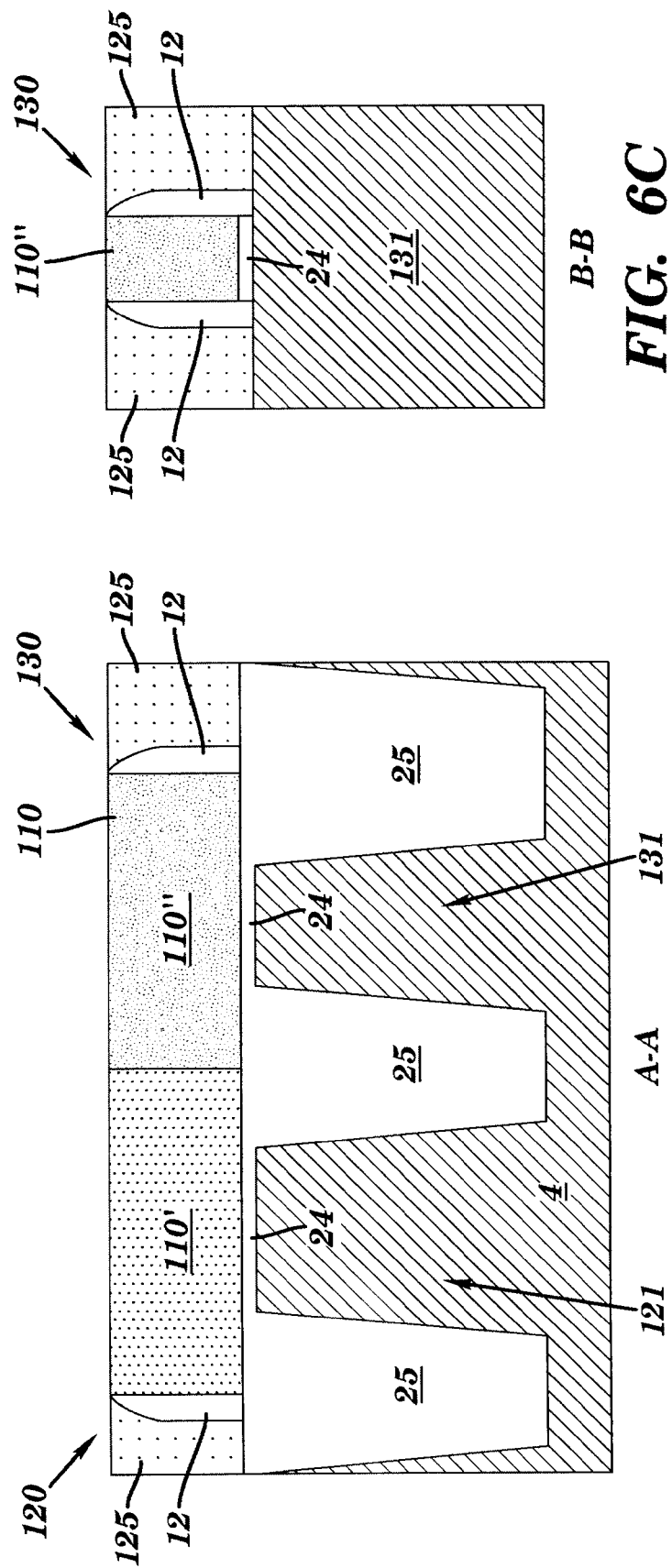

FIGS. 6-9 and 11-15 illustrate process steps, according to one embodiment of the invention, for forming a diffusion barrier region 150. FIG. 6 illustrates a semiconductor structure including nFET 120 and pFET 130 regions formed in the semiconductor substrate 4, which may be formed by methods now known in the art, or developed in the future. Isolation regions 125 are between the nFET 120 and pFET 130 regions. The gate conductor 110 is formed atop gate dielectrics 24 over the nFET channel 121 and pFET channel 131. Spacers 12 may be formed on the sidewalls of the gate conductor 110. The gate conductor 110 includes a first doped region 110', e.g. N+ dopants in the nFET region 120, and a second doped region 110", e.g. P+ dopants in the pFET region 130. In addition, implants are formed in the substrate 4 adjacent the gate conductors to form source/drain regions (not shown) for the nFET and pFET, as is known in the art. Commonly used N+ dopants include As, P, and Sb, and P+ dopants include B and In. A sacrificial dielectric layer 125, such as a spin-on low k dielectric, is deposited over the structure, and then planarized to be coplanar with the gate conductor 110, for example, by chemical-mechanical polishing (CMP).

Figure 7A:
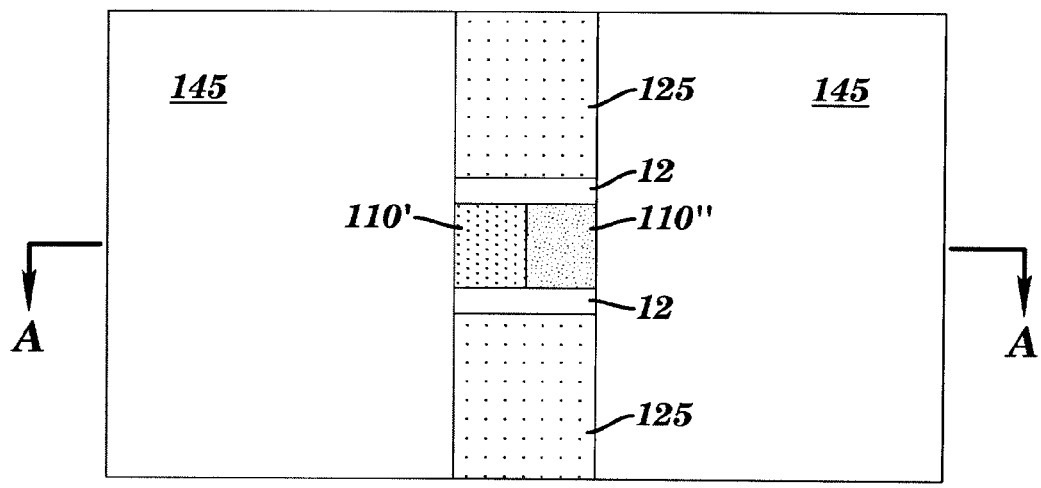
FIGS. 7A-7B through 9A-9B and 11A-11B through 14A-14B illustrate top-down and a cross-sectional view of the structure during process steps of an embodiment of a method of forming the inventive structure.
Figure 7B:
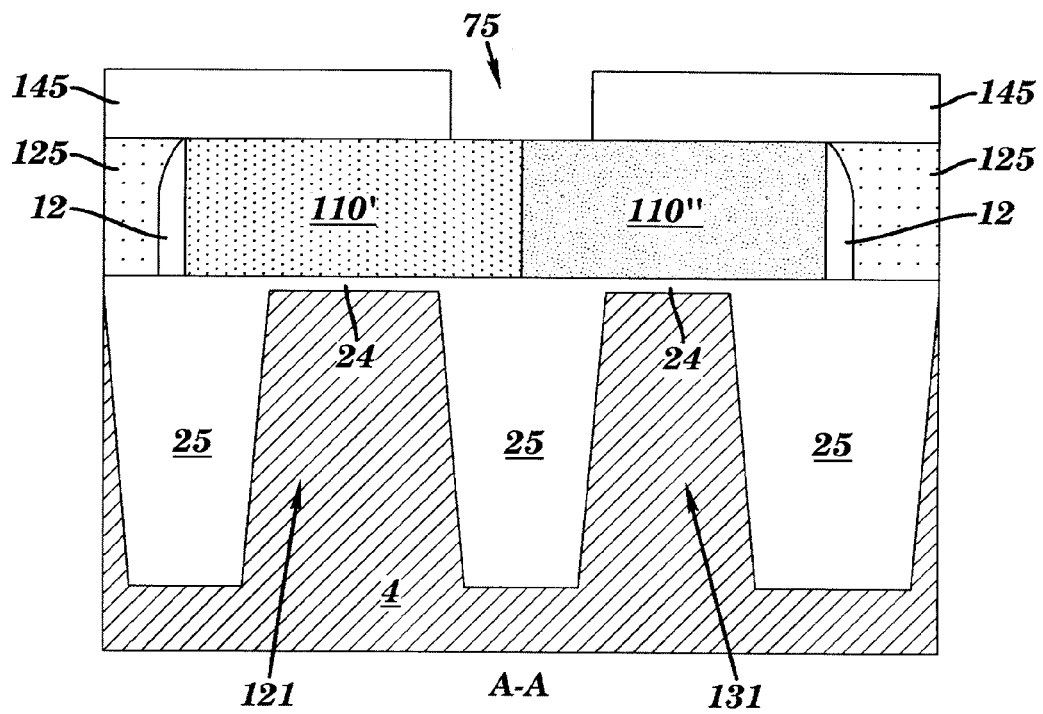

Next, referring to FIG. 7, a hardmask 145 is formed over the structure of FIG. 6, and patterned to form an opening 75 that exposes the gate conductor between the first doped region 110' and the second doped region 110" in the gate conductor. For example, this may be done by depositing a hardmask layer, comprising, for example, SiN or SiC, atop the planarized surface of the gate conductor 110, the spacers 12 and sacrificial 125. The hardmask may be patterned by any suitable method known in the art, for example, by depositing a photoresist layer, patterning an opening in the photoresist layer using a lithographic process (not shown) and transferring the patterned opening into the hardmask using an anisotropic etch, such as reactive ion etch (RIE). The resist layer is then removed, resulting in the structure illustrated in FIG. 7.

Figure 8A:
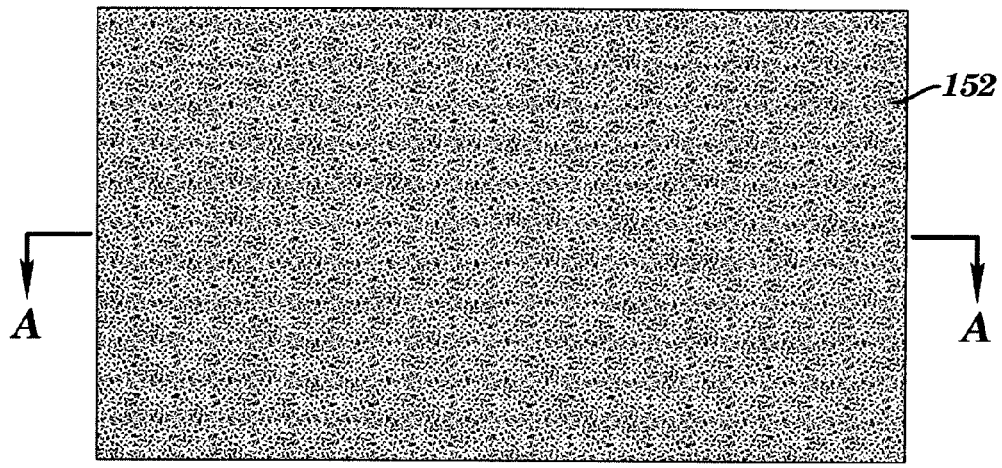
Figure 8B:
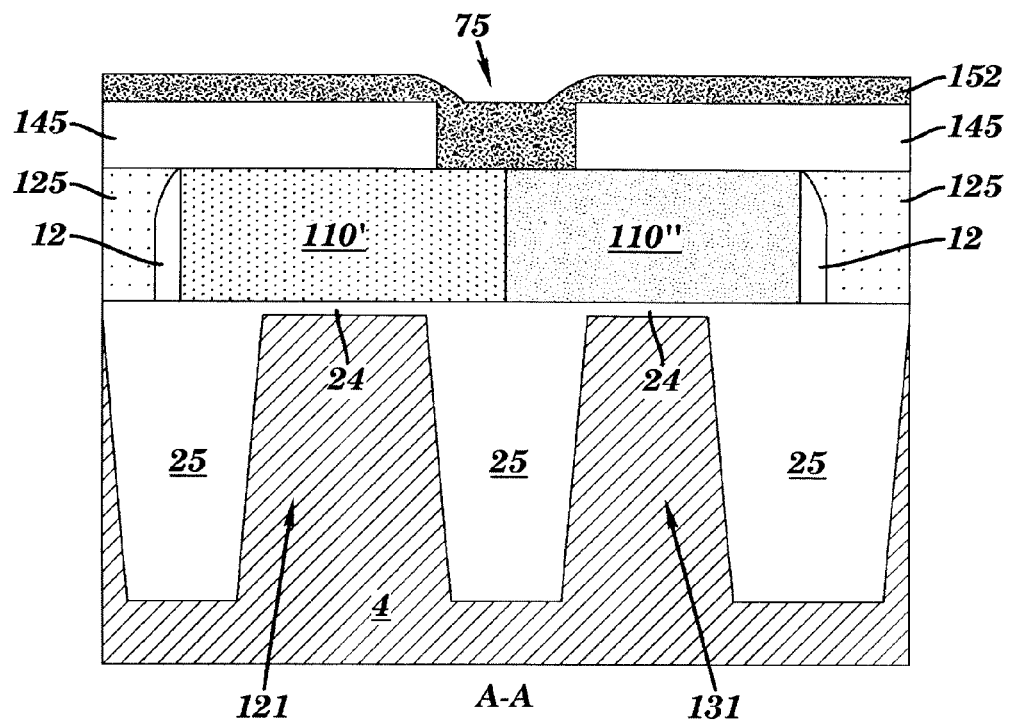

Next, referring to FIG. 8, a diblock copolymer 152 is applied atop the structure of FIG. 7, so that the opening 75 is filled. A diblock copolymer consists of two immiscible polymer blocks that covalently bond at one end of each other. When given sufficient mobility, they self-assemble to minimize surface energy. Preferably, first and second polymeric block components have a weight ratio of from about 80:20 to about 60:40. According to a preferred embodiment, the diblock copolymer comprises polystyrene (PS) and poly (methyl-methacrylate) (PMMA), with PS-b-PMMA having a PS:PMMA weight ratio ranging from about 80:20 to about 60:40. The thickness of the diblock film can be controlled by spin speed and concentration of a solvent, for example, toluene. The surface of the wafer is preferably be treated with a neutralizing layer 69 (see FIG. 10), which is a random copolymer that is composed of monomers from the two copolymer blocks.

Figure 9A:
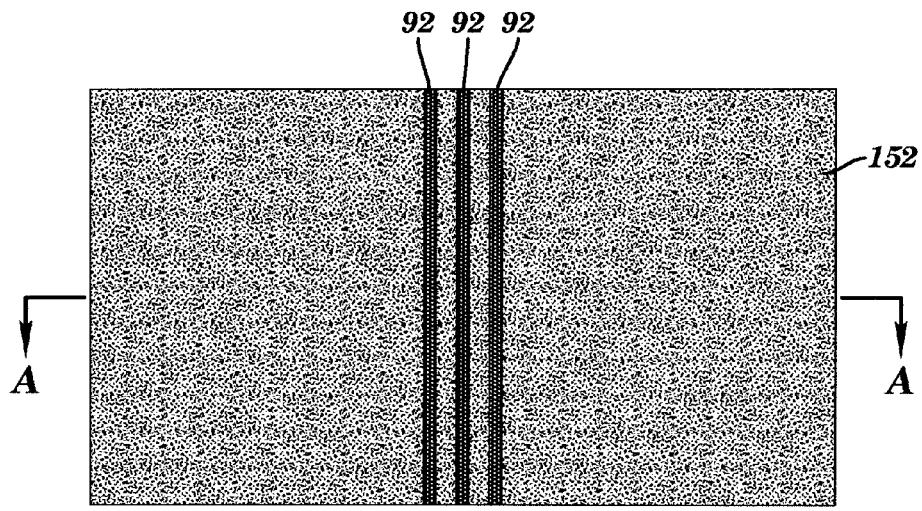
Figure 9B:
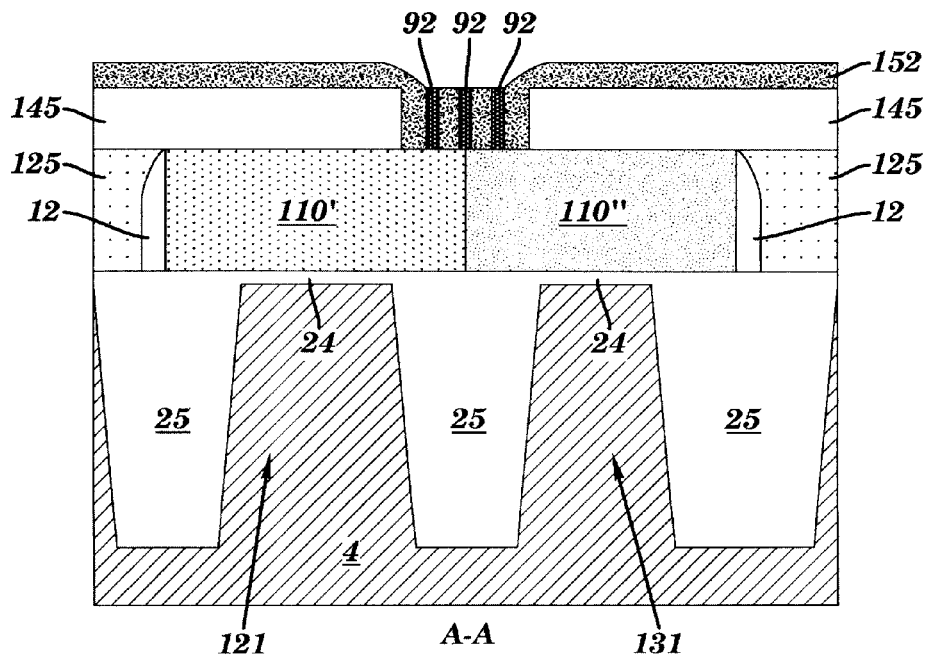

Next, referring to FIG. 9, an anneal is performed to form regular patterns in the diblock copolymer 152 within the filled opening 75. Preferably the regular patterns comprise patterns 92 that are organized in elongated, preferably linear, patterns that traverse the width of the gate conductor 110. Formation of linear patterns may be controlled by adjusting the ratio of copolymers and by adjusting the wetting properties of the neutralization layer 69 relative to one of the diblock copolymers. Such dimensions of the self-organized patterns are sublithographic due to the molecular weight and dimension of the self-organizing copolymer molecules. In other words, the width of the patterns will be typically approximately equal to a small multiple of the length of the copolymer molecules. Note that the copolymer deposited outside the opening 75 will not typically be too thin to form organized patterns. Even if such patterns do form, they will not be transferred to the underlying substrate except through the opening 75.

Figures 10A, 10B:
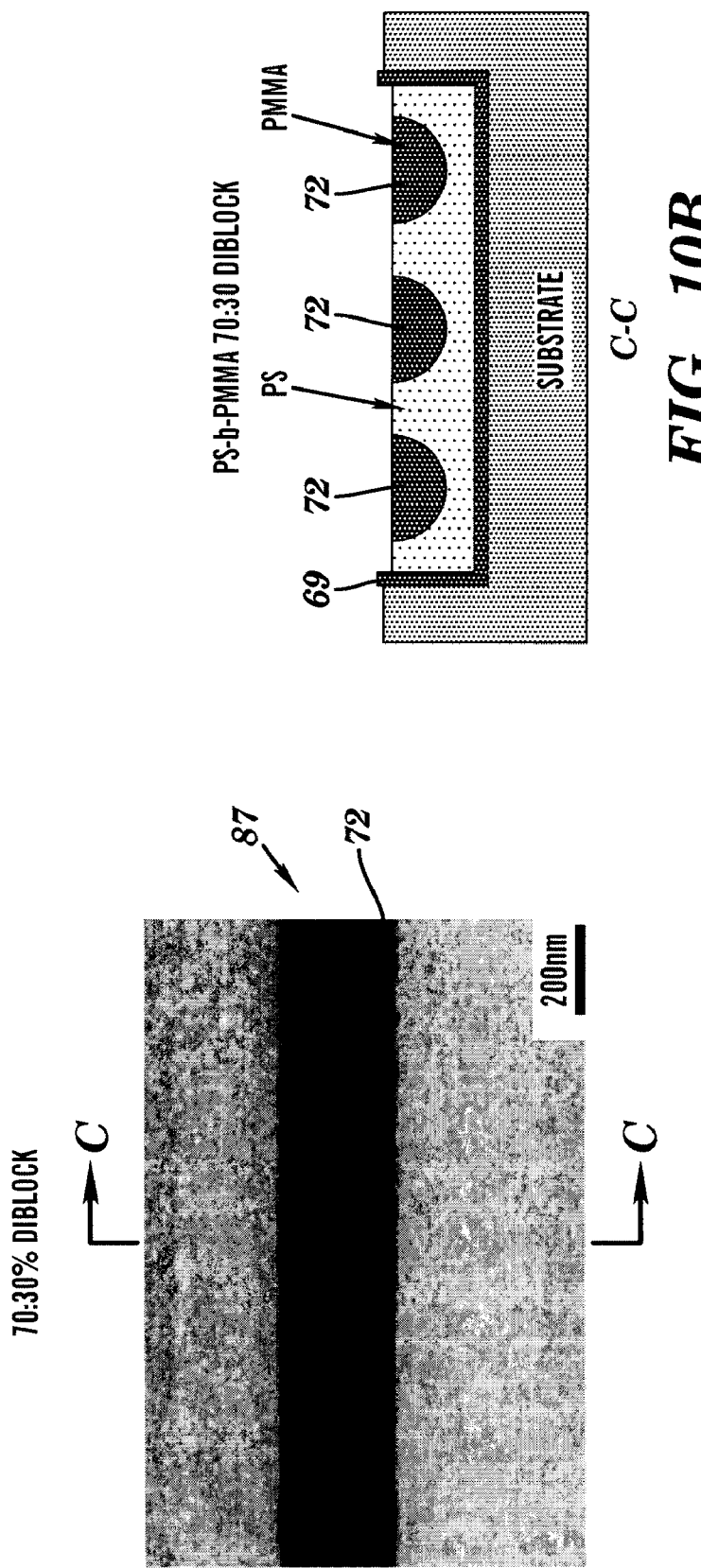
FIG. 10A illustrates a top-down view of an SEM of a diblock copolymer having a self-organized pattern substantially co-linear with a hardmask opening.
FIG. 10B illustrates a schematic cross-sectional view of the diblock copolymer linear pattern of FIG. 10A.

For example, FIG. 10A illustrates a top-down view of a scanning electron microscope (SEM) image of a linear hardmask opening filled with an asymmetric diblock copolymer composed of 70% polystyrene (PS) and 30% poly(methyl-methacrylate) (PMMA) after annealing at 180° C. FIG. 10B is a schematic cross-section along the line C-C in FIG. 10A. The PMMA has self-organized into lines 72 that run substantially parallel to the lengthwise orientation of the hardmask opening 87. A surface neutralization layer 69 is located between the diblock copolymer and the substrate. The surface neutralization layer 69 comprises a random copolymer monomer.

Figure 11A:
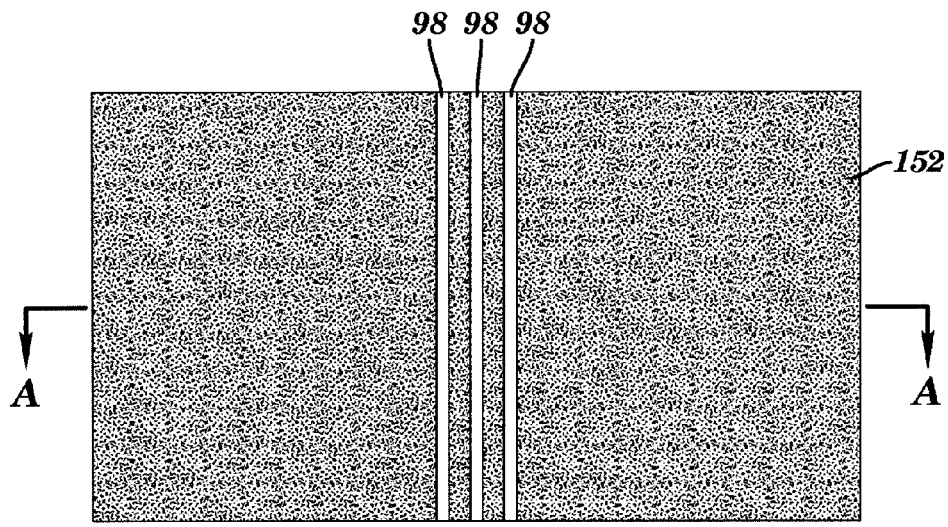
Figure 11B:
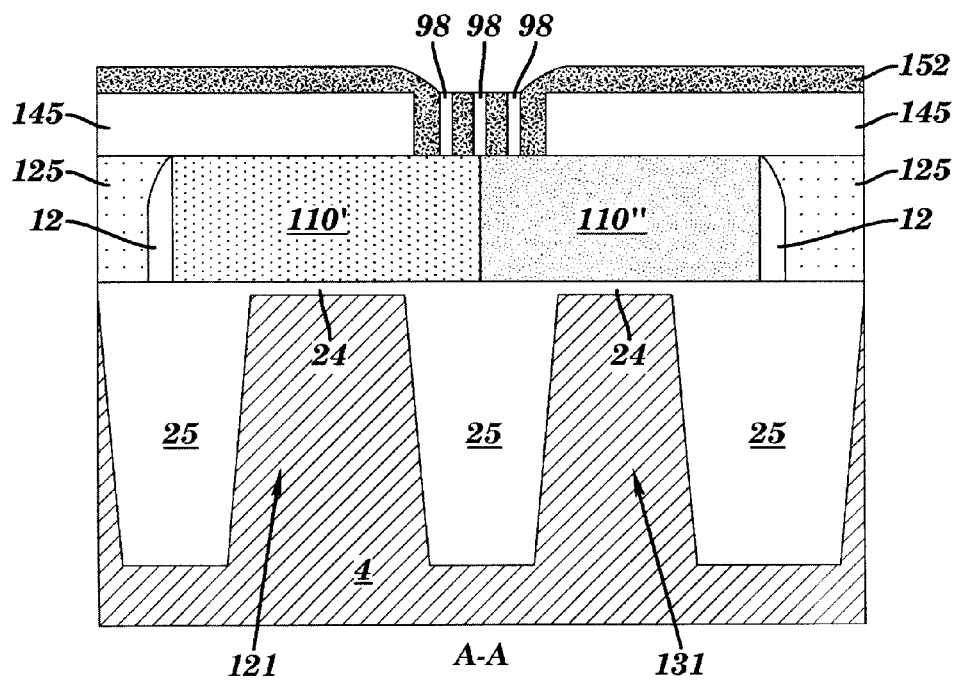

Next, referring to FIG. 11, the copolymer that forms the regular patterns is removed, for example, by immersing the copolymer system in an acetic acid solution to form openings 98 in the annealed copolymer layer 152. Preferably, the width of the openings 98 are in the range from about 5 nm to about 40 nm, and most preferably from about 10 nm to 30 nm.

Figure 12A:
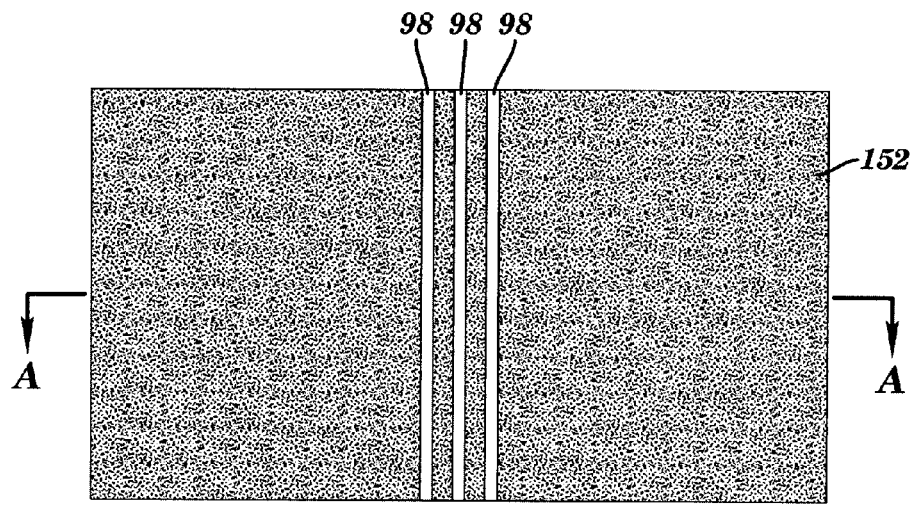
Figure 12B:
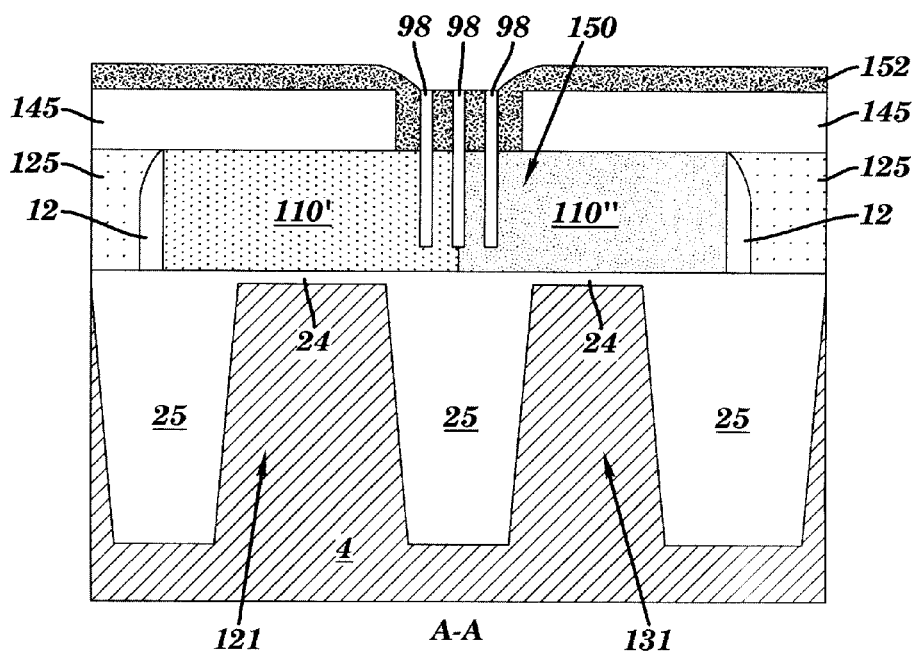

Next, referring to FIG. 12, the patterned copolymer layer 152 is used as a mask, and an anisotropic etch is performed, e.g. by a RIE process, to transfer the openings 98 into the gate conductor 110 to form the barrier region 150. The openings 98 may extend through the gate conductor 110 and terminate on the STI 25 so as to form a physical barrier to diffusion. Optionally, the openings 98 may terminate at a depth within the gate conductor that is sufficiently deep so that diffusion is minimized, and the highest concentration of dopants in an upper portion of the implanted gate conductor is substantially prevented from cross-diffusion across the barrier region 150. Alternatively, the openings 98 need not be limited to elongated patterns that traverse the width of the gate conductor, but may be organized into a sufficiently high density of patterned openings so that cross-diffusion across the barrier region 150 is minimized. Such high density patterns may be formed by altering the copolymer composition or surface neutralization layer property. The high density sublithographic patterns are preferably configured so as to reduce cross-diffusion of an implant species across the barrier region to a minimal amount during an activation anneal, such that changes in Vt are minimized.

Figure 13A:
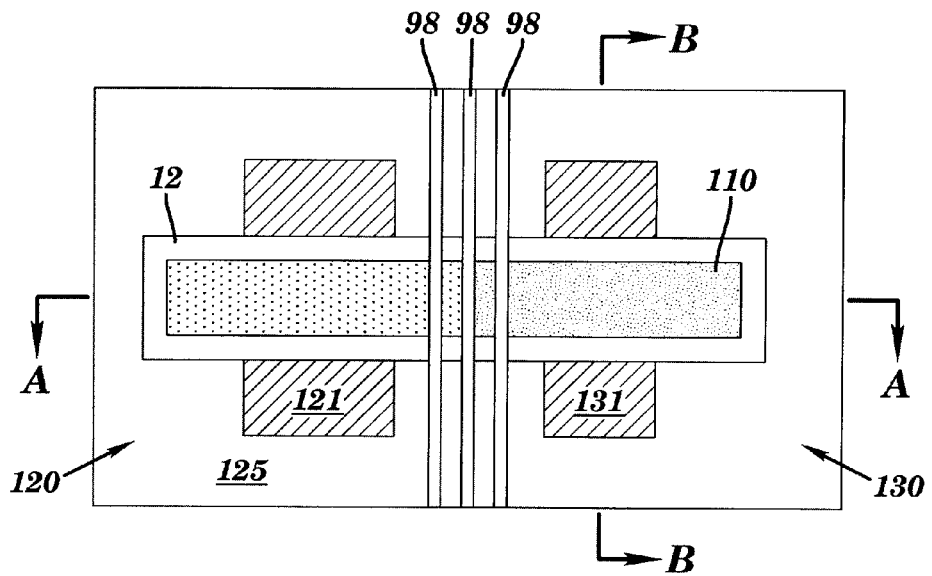
Figure 13B:
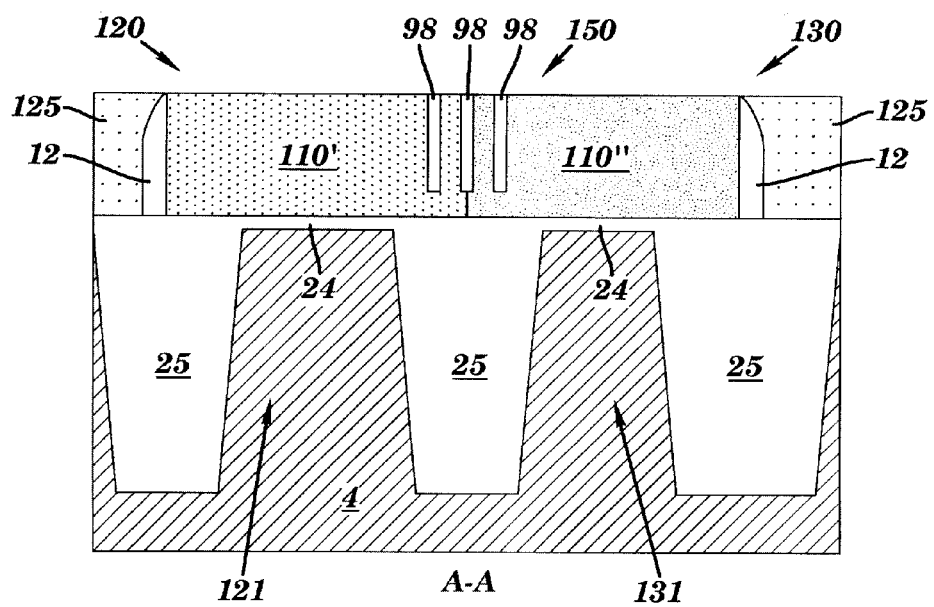

Next, the copolymer layer 152 and the hardmask 145 are removed, resulting in the structure illustrated in FIG. 13.

Figure 14A:
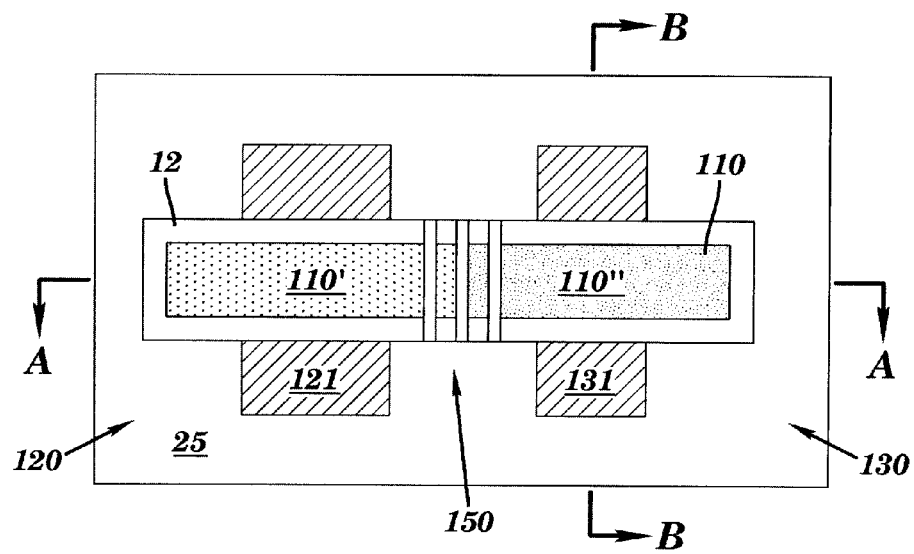
Figure 14B:
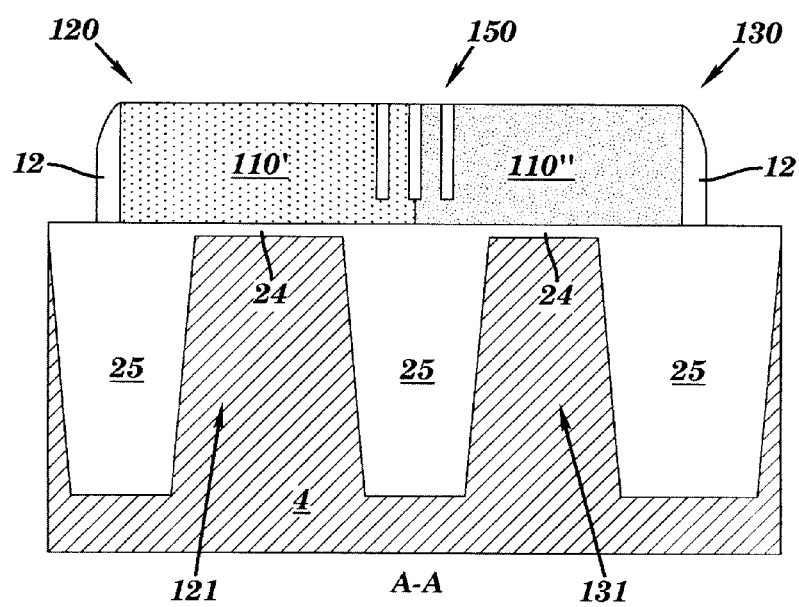
Figure 15A:
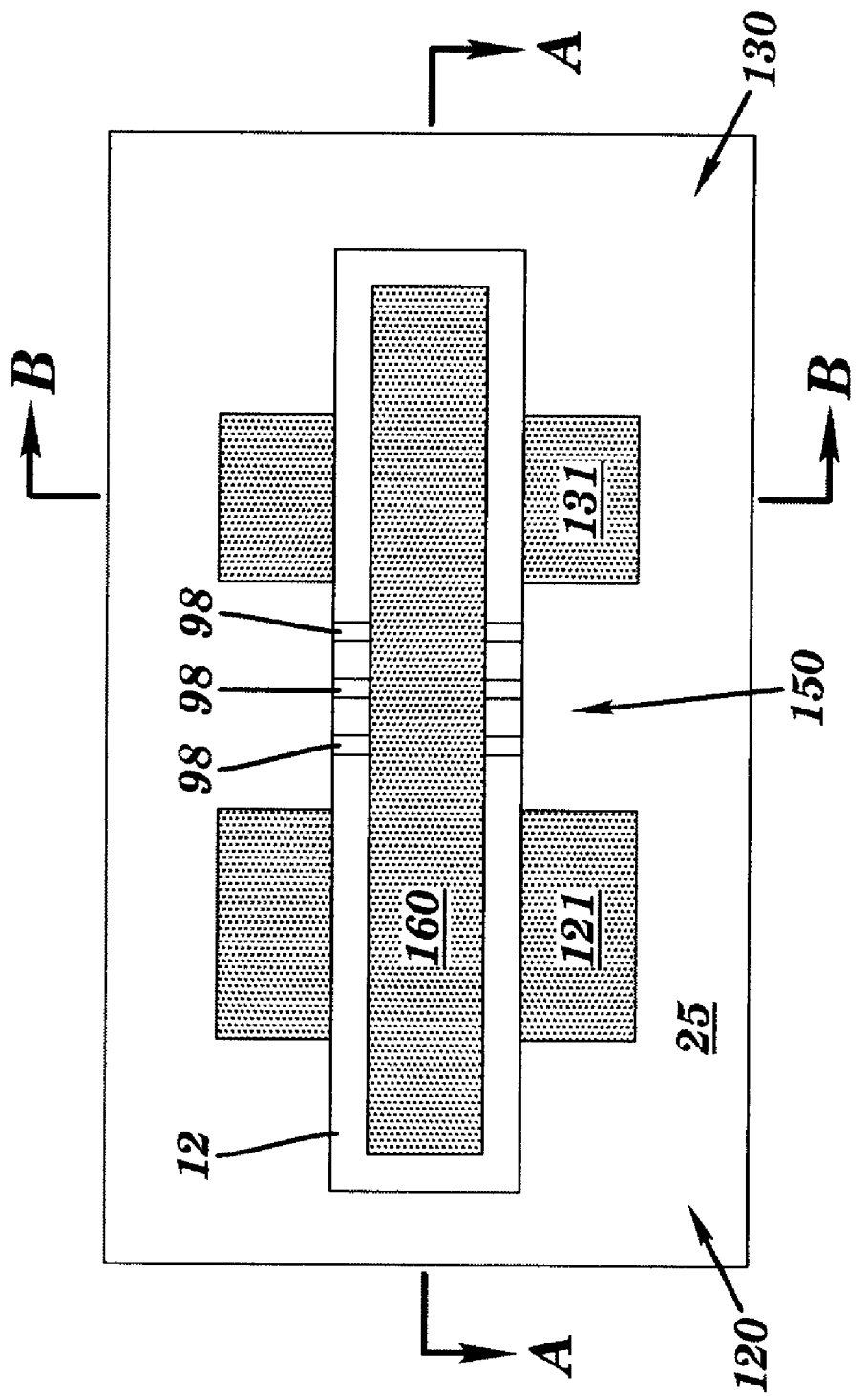

Next, the sacrificial layer 125 is removed, resulting in the structure illustrated in FIG. 14.

Next, a dopant activation anneal is applied to activate the implanted N+ dopants 110' and P+ dopants 110", for example, at a temperature between about 900 to 1100° C. At these temperatures, diffusion of the dopants will occur. In accordance with the invention, the density and/or extent of the gaps in the barrier region will minimize or prevent cross-diffusion between the N+ and P+ regions during such an activation anneal, so that the changes in Vt are minimized, to an amount according the requirements of a particular circuit application.

Subsequently, a silicide or semiconductor-metal alloy 160 may be formed atop the semiconductor substrate over the source/drain regions adjacent the gate conductor and the gate conductor 110, including within the air gaps (not shown). Then, the devices may be completed, as known in the art.

The inventive barrier region 150 has the advantage of completely or substantially preventing cross-diffusion between adjacent devices that have different dopant species, thus avoiding cross-diffusion without impacting layout density as the ground rules shrink.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming a gate conductor structure in a semiconductor device, comprising:
    forming a lithographically patterned mask layer over an upper surface of a gate conductor structure, wherein said lithographically patterned mask layer comprises a mask opening;
    applying a layer of a block copolymer over the lithographically patterned mask layer, wherein said block copolymer comprises a first polymeric block component and a second polymeric block component;
    annealing the layer said block copolymer to form a polymer block pattern inside said mask opening, and wherein said polymer block pattern comprises said second polymeric block component embedded in a polymeric matrix that comprises said first polymeric block component;

selectively removing said second polymeric block component relative to said first polymeric block component to form a matrix opening in said polymeric matrix within said mask opening; and patterning said gate conductor structure using said matrix opening in said polymeric matrix.

2. The method of claim 1, wherein said first and second polymeric block components have a weight ratio of from about 80:20 to about 60:40.

3. The method of claim 1, wherein said block copolymer comprises PS-b-PMMA having a PS: PMMA weight ratio ranging from about 80:20 to about 60:40.

4. The method of claim 1, wherein said polymer block pattern comprises a line of said second polymeric block component that traverses at least a width of said gate conductor structure.

5. The method of claim 1, wherein said polymer block pattern comprises a feature having a sublithographic dimension.

6. The method of claim 1, wherein said mask opening is located between an N-type device and a P-type device.

7. The method of claim 1, wherein said polymer block pattern comprises a plurality of sublithographic features having a sufficiently high density such that the step of patterning said gate conductor forms a barrier region such that diffusion of dopants across said barrier region is reduced during an activation anneal so that changes in Vt are minimized.

* * * * *